United States Patent
Xiao et al.

(10) Patent No.: US 8,274,119 B2
(45) Date of Patent: Sep. 25, 2012

(54) HYBRID MATERIAL ACCUMULATION MODE GAA CMOSFET

(75) Inventors: Deyuan Xiao, Shanghai (CN); Xi Wang, Shanghai (CN); Miao Zhang, Shanghai (CN); Jing Chen, Shanghai (CN); Zhongying Xue, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 133 days.

(21) Appl. No.: 12/810,648

(22) PCT Filed: Feb. 11, 2010

(86) PCT No.: PCT/CN2010/070645
§ 371 (c)(1),
(2), (4) Date: Jun. 25, 2010

(87) PCT Pub. No.: WO2011/066728
PCT Pub. Date: Jun. 9, 2011

(65) Prior Publication Data
US 2011/0254100 A1    Oct. 20, 2011

(30) Foreign Application Priority Data

Dec. 1, 2009 (CN) .......................... 2009 1 0199723

(51) Int. Cl.
*H01L 21/70* (2006.01)

(52) U.S. Cl. . 257/369; 257/350; 257/368; 257/E27.108; 257/E27.062

(58) Field of Classification Search .................. 257/369, 257/351, 204, 206, 296, 350, 368, E27.108, 257/E27.062
See application file for complete search history.

(56) References Cited

U.S. PATENT DOCUMENTS

| 2006/0151837 A1* | 7/2006 | Chen et al. ..................... 257/369 |
| 2008/0173944 A1* | 7/2008 | Coronel et al. ................ 257/351 |
| 2010/0207172 A1* | 8/2010 | Masuoka et al. .............. 257/255 |
| 2011/0254099 A1* | 10/2011 | Xiao et al. ..................... 257/369 |

* cited by examiner

*Primary Examiner* — Olik Chaudhuri
*Assistant Examiner* — Wilner Jean Baptiste
(74) *Attorney, Agent, or Firm* — Global IP Services; Tianhua Gu

(57) ABSTRACT

A Ge and Si hybrid material accumulation mode GAA (Gate-All-Around) CMOSFET includes a PMOS region having a first channel, an NMOS region having a second channel and a gate region. The first channel and the second channel have a racetrack-shaped cross section and are formed of p-type Ge and n-type Si, respectively; the surfaces of the first channel and the second channel are substantially surrounded by the gate region; a buried oxide layer is disposed between the PMOS region and the NMOS region and between the PMOS or NMOS region and the Si substrate to isolate them from one another. In an accumulation mode, current flows through the overall racetrack-shaped channel. The disclosed device has high carrier mobility, high device drive current, and maintains the electrical integrity of the device. Meanwhile, polysilicon gate depletion and short channel effects are prevented.

18 Claims, 10 Drawing Sheets

HYBRID MATERIAL ACCUMULATION MODE GAA CMOSFET

CROSS REFERENCE TO RELATED PATENT APPLICATION

The present application is the US national stage of PCT/CN2010/070645 filed on Feb. 11, 2010, which claims the priority of the Chinese patent application No. 200910199723.8 filed on Dec. 1, 2009, which application is incorporated herein by reference.

BACKGROUND OF THE INVENTION

1. Technical Field

The present invention relates generally to the field of semiconductor manufacturing technologies and more particularly to a hybrid material accumulation mode GAA (Gate-All-Around) CMOSFET (Complementary Metal Oxide Semiconductor Field Effect Transistor).

2. Description of Related Art

A CMOS device integrates both NMOS (N-type Metal Oxide Semiconductor) and PMOS (P-type Metal Oxide Semiconductor) transistors in one device. As the device size continues to shrink, a major challenge in scaling down the channel length is to maintain a high current drive capability ($I_{on}$) and a stable threshold voltage, and control the device leakage current ($I_{off}$) at the same time. Short channel effect (SCE) degrades device performance and is a severe obstacle to scale down the channel length.

SOI (Silicon on Insulator) technology uses an 'engineered' substrate in place of a conventional bulk silicon substrate. The 'engineered' substrate is composed of three layers: a thin monocrystalline silicon top layer with circuits etched thereon; a thin buried oxide (BOX) layer formed of silicon dioxide; and a thick bulk silicon substrate for providing mechanical support to the two layers thereabove. In such a structure, the buried oxide layer separates the monocrystalline silicon top layer from the bulk silicon substrate, so large-area p-n junctions are replaced with a dielectric isolation. Meanwhile, source and drain regions extend downward into the buried oxide layer, which effectively reduce the leakage current and junction capacitance. For nanometer-scale channel length CMOS devices, it is important to control the channel conductance mainly through a gate electric field without being affected by a drain scattering electric field. For SOI devices, the above-described problem is alleviated with the reduced silicon thickness in both partial-depletion and full-depletion structures. Compared with the conventional planar CMOS devices, inversion mode dual-gate or tri-gate fin-type FETs have better gate control and scaling down capabilities. Besides operating in an inversion mode, ultra-thin SOI devices can also operate in an accumulation mode. Comparing to the full-depletion FET, in an accumulation mode, current flows through the whole SOI device, which increases the carrier mobility, reduces low-frequency noises, lowers the short channel effect, and increases the threshold voltage so as to avoid polysilicon gate depletion effect. In an inversion mode FET, the type of impurities doped in the source and drain regions is different from that in the channel region, the charge transfer is of minority carriers, and p-n junctions are formed between the source region and the channel region and between the drain region and the channel region, respectively. The inversion mode FETs are currently the most widely used devices. On the other hand, in an accumulation mode FET, the source and drain regions are doped with impurities of the same type as that of the channel region, the charge transfer is of majority carriers, and there is no p-n junction. Since the carrier mobility is the bulk material mobility, the accumulation mode FET achieves high carrier mobility.

Further, in Si(110) substrates, current flows along <110> crystal orientation, hole mobility is more than doubled compared with in conventional Si(100) substrates, and electron mobility is the highest in Si(100) substrates. To fully utilize the advantage of the carrier mobility depending on crystalline orientation, M. Yang et al. at IBM developed a CMOS fabricating technology on hybrid substrates with different crystal orientations ('High performance CMOS fabricated on hybrid substrate with different crystal orientations', Digest of Technical Paper of International Electron Devices Meeting, 2003). Through bonding and selective epitaxy growth techniques, an NMOS device is fabricated on a Si (100) surface and a PMOS device is fabricated on a Si (110) surface. The paper reported the drive current of the PMOS device on the Si(110) substrate increases by 45%, when $I_{off}$=100 nA/μm. The drawback of this technology is that the PMOS device fabricated in the epitaxial layer is not isolated from the substrate with buried oxide and thus the leakage current will be high.

Therefore, there is a need to develop new CMOSFET devices to overcome the above-described problems.

SUMMARY OF THE INVENTION

The present invention provides a hybrid material accumulation mode GAA CMOSFET, which includes: a semiconductor substrate, a PMOS region having a first channel, an NMOS region having a second channel, and a gate region, wherein the NMOS region is disposed above the semiconductor substrate and the PMOS region is disposed above the NMOS region. The NMOS region and the PMOS region each includes a source region and a drain region located at the two opposite ends of the channel thereof. The first channel and the second channel each has a racetrack-shaped cross section having a rectangular central portion and two substantially semicircular end portions at both the opposite ends of the rectangular central portion respectively, wherein the first channel is formed of p-type Ge and the second channel is formed of n-type Si; the surfaces of the first channel and the second channel are substantially surrounded by the gate region; a first buried oxide layer is disposed between the PMOS region and the NMOS region; and a second buried oxide layer is disposed between the NMOS region and the semiconductor substrate.

In another embodiment of the present invention, a hybrid material accumulation mode GAA CMOSFET includes: a semiconductor substrate, a PMOS region having a first channel disposed above the semiconductor substrate, an NMOS region having a second channel disposed above the PMOS region, and a gate region. The PMOS region and the NMOS region each includes a source region and a drain region located at the two opposite ends of the channel thereof respectively. The first channel and the second channel each has a racetrack-shaped cross section having a rectangular central portion and two substantially semicircular end portions at the opposite ends of the rectangular central portion respectively, wherein the first channel is formed of p-type Ge and the second channel is formed of n-type Si; the surfaces of the first channel and the second channel are substantially surrounded by the gate region; a first buried oxide layer is disposed between the PMOS region and the NMOS region; and a second buried oxide layer is disposed between the PMOS region and the semiconductor substrate.

The device structure according to the prevent invention is quite simple, compact and highly integrated. In an accumulation mode, current flow through the overall racetrack-shaped channel, so as to achieve high carrier mobility, reduce low-frequency noises, increase the cross-sectional area of the channel, increase the device drive current, maintain the electrical integrity of the device, prevent polysilicon gate depletion and short channel effects and increase the threshold voltage of the device.

BRIEF DESCRIPTION OF DRAWINGS

FIGS. 1a-1c show the structure of a GAA CMOSFET device according to a first embodiment of the present invention, wherein FIG. 1a is a top view of the device, FIG. 1b is a cross-sectional view along a line XX' in FIG. 1a, and FIG. 1C is a cross-sectional view along a line ZZ' in FIG. 1a;

FIG. 4b is a cross-sectional view along a line XX' in FIG. 4a;

FIGS. 5a-5c show the structure of a GAA CMOSFET device according to a second embodiment of the present invention, wherein FIG. 5a is a top view of the device, FIG. 5b is a cross-sectional view along a line XX' in FIG. 5a, and FIG. 5C is a cross-sectional view along a line ZZ' in FIG. 5a;

FIG. 6b is a cross-sectional view along a line XX' in FIG. 6a.

DETAILED DESCRIPTION OF PREFERRED EMBODIMENTS

The following illustrative embodiments are provided to illustrate the disclosures of the present invention. It should be noted that figures are schematic representations of devices, and not drawn to scale.

First Embodiment

Figure 1A:
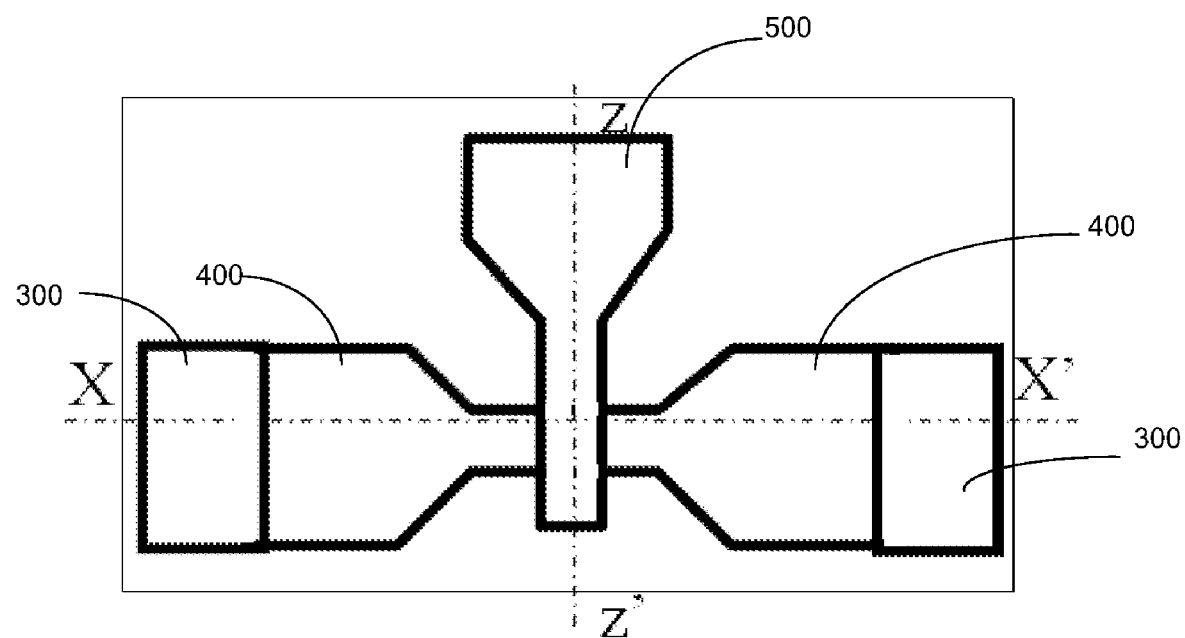
Figure 1B:
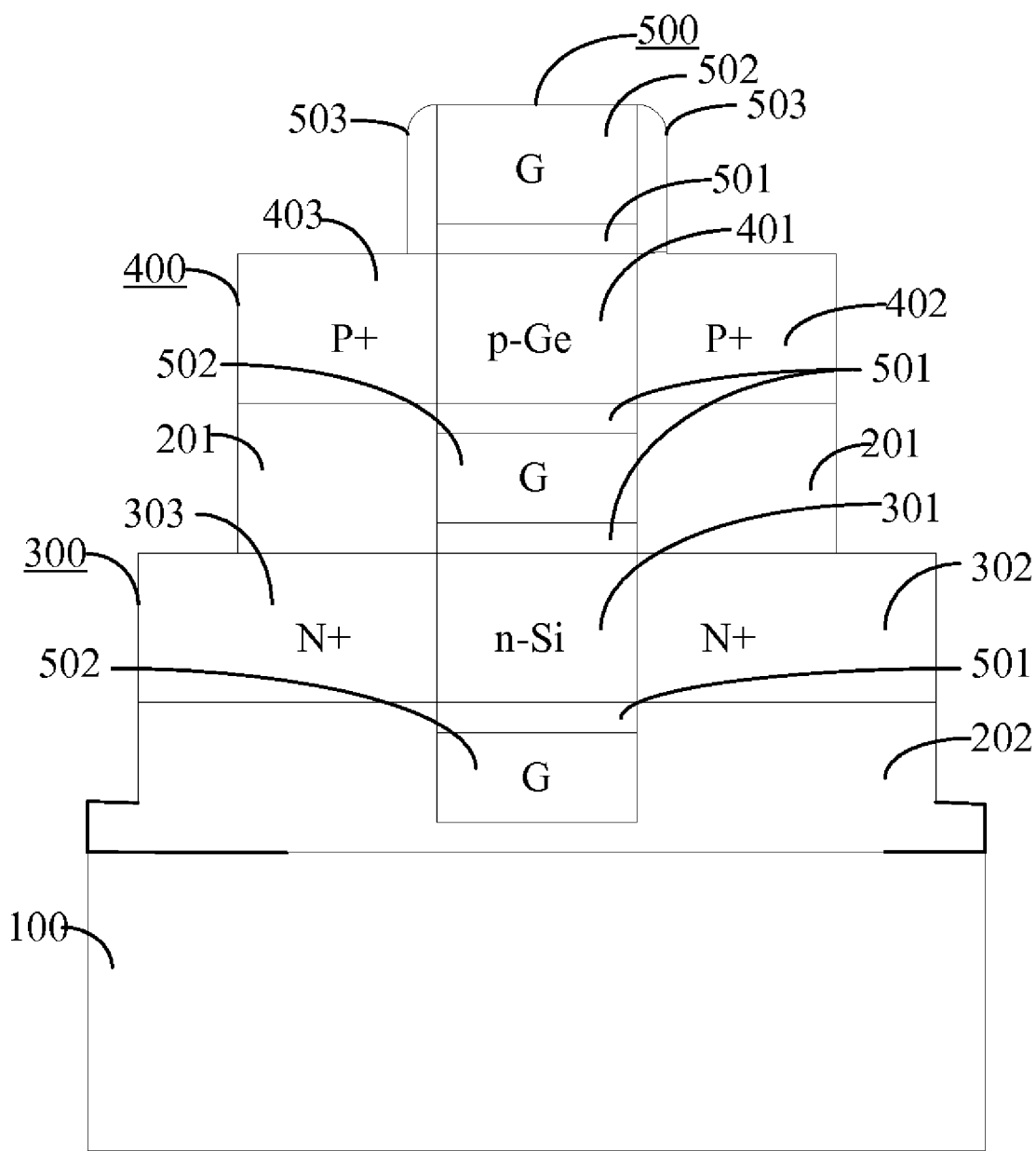
Figure 1C:
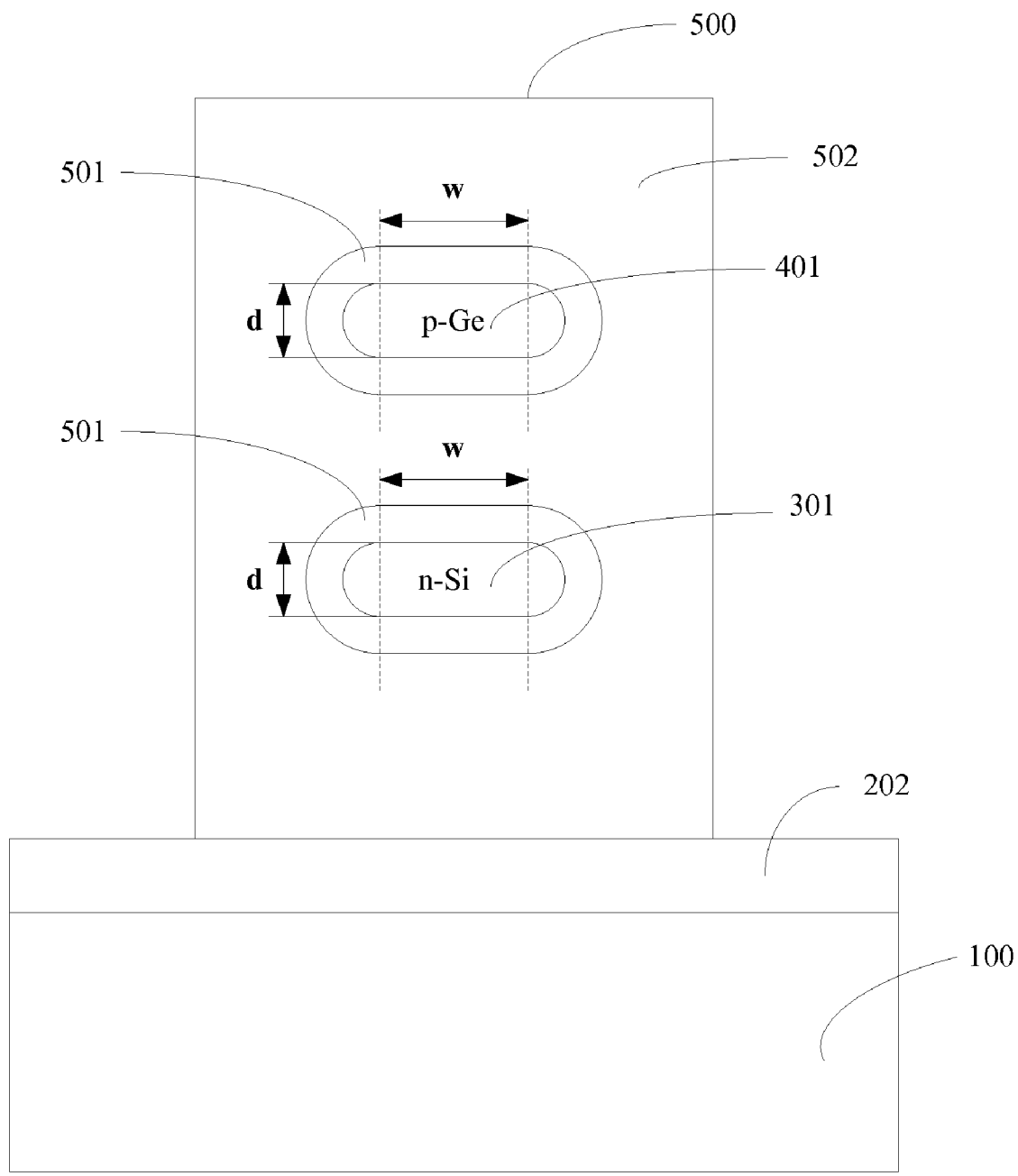
Figure 3:
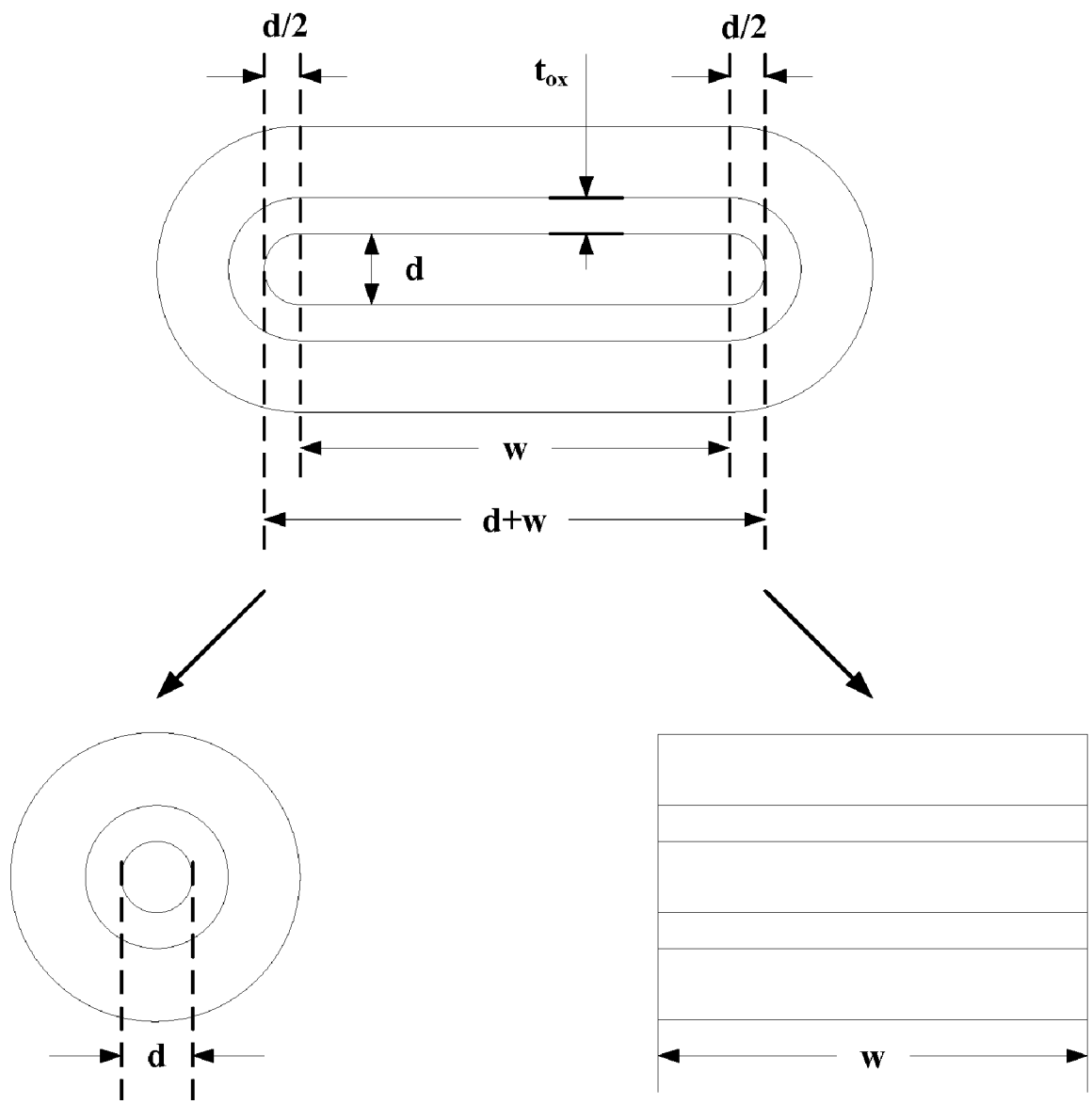
FIG. 3 is a cross-sectional view of a channel of a GAA CMOSFET device according to the embodiments of the present invention.

Referring to FIGS. 1a-1c, a hybrid material accumulation mode GAA CMOSFET of the first embodiment includes: a semiconductor substrate 100, a PMOS region 400 having a channel 401, an NMOS region 300 having a channel 301, and a gate region 500. Each of the channels 401, 301 has a racetrack-shaped cross section. The channel 401 is preferably formed of p-type Ge and the second channel 301 is preferably formed of n-type Si. The gate region 500 substantially surrounds the surfaces of the channels 401, 301. The racetrack-shaped cross section of the channels 401, 301 has a rectangular central portion and two substantially semicircular end portions at the opposite sides of the rectangular central portion. As shown in FIG. 3, the device is equivalent to a dual-gate channel structure and a GAAC structure, which are operated independently, wherein d is the diameter of the two semicircular end portions, w is the width of the rectangular central portion, the overall width of the racetrack-shaped cross section is d+w, and tox is the thickness of the gate dielectric layer.

In FIG. 1b, a first buried oxide (BOX) layer 201 is disposed between the PMOS region 400 and the NMOS region 300, other than the gate region 500, to avoid inter-region interference. A second buried oxide layer 202 is disposed between the NMOS region 300 and the underlying semiconductor substrate 100 (i.e. Si substrate), other than the gate region 500, to isolate the NMOS region 300 from the underlying semiconductor substrate 100. The BOX layers effectively reduce the leakage current and improve the device performance.

The PMOS region 400 comprises a source region 403 and a drain region 402 located at the opposite ends of the channel 401. The NMOS region 300 comprises a source region 303 and a drain region 302 located at the opposite ends of the channel 301. The source region 403 and the drain region 402 of the PMOS region 400 are formed of heavily doped p-type Ge, and the source region 303 and the drain region 302 of the NMOS region 300 are formed of heavily doped n-type Si. As shown in FIG. 1b, the source region 303 and the drain region 302 of the NMOS region 300 have a length greater than that of the source region 403 and the drain region 402 of the PMOS region 400, respectively, so that the electrodes from the source region 303 and the drain region 302 can be led out. Referring to FIG. 1a, the width of the source and drain regions perpendicular to the channel direction XX' is greater than the width of the channel, that is, both the PMOS region 400 and the NMOS region 300 are of a fin shape, which is narrow at the center and wide at the ends. Ge in the PMOS region 400 has (111) crystal orientation; and Si in the NMOS region 300 has (100) crystal orientation.

Referring to FIGS. 1b and 1c, the gate region 500 includes: a gate dielectric layer 501 substantially surrounding the surfaces of the channels 401, 301, and a gate electrode material layer 502 substantially surrounding the gate dielectric layer 501. The gate electrode material layer 502 is selected from the group consisting of titanium, nickel, tantalum, tungsten, tantalum nitride, tungsten nitride, titanium nitride, titanium silicide, tungsten silicide, nickel silicide, and a combination thereof; the gate dielectric layer 501 is formed of an insulating dielectric material comprising silicon dioxide, silicon oxynitride, silicon oxycarbide or a hafnium-based high-k material. Further, the underlying substrate 100 is formed of a semiconductor material such as Si, Ge, Ga and In.

Figure 2:
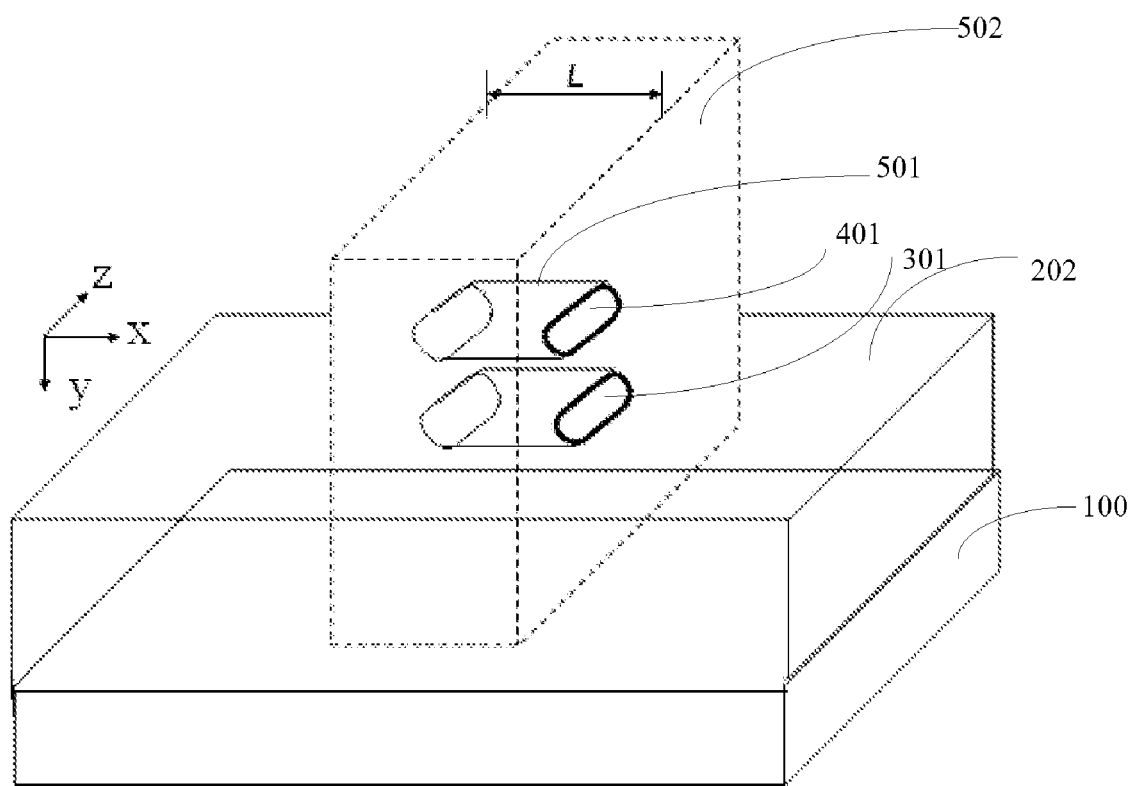
FIG. 2 is a perspective view of the channel of the GAA CMOSFET device according to the first embodiment of the present invention.

Referring to FIGS. 1c, 2 and 3, the channels 401, 301 each has a length L in the range of 10-50 nm, the semicircular end portions of the cross section thereof have a diameter d in the range of 10-80 nm, the rectangular central portion has a width W in the range of 10-200 nm. The first buried oxide layer 201 and the second buried oxide layer 202 each has a thickness in the range of 10-200 nm and is formed of silicon dioxide. Preferably, a Si passivation layer is disposed between the surface of the first channel 401 and the gate dielectric layer 501 and has a thickness in the range of 0.5-1.5 nm (not shown).

Figure 4A:
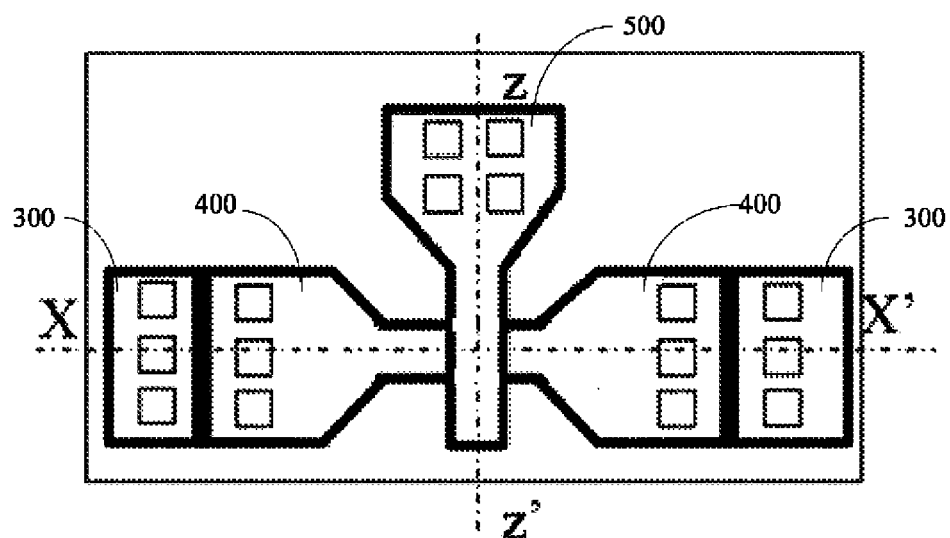
FIG. 4a is a top view of an accumulation mode FET according to the first embodiment of the present invention.
Figure 4B:
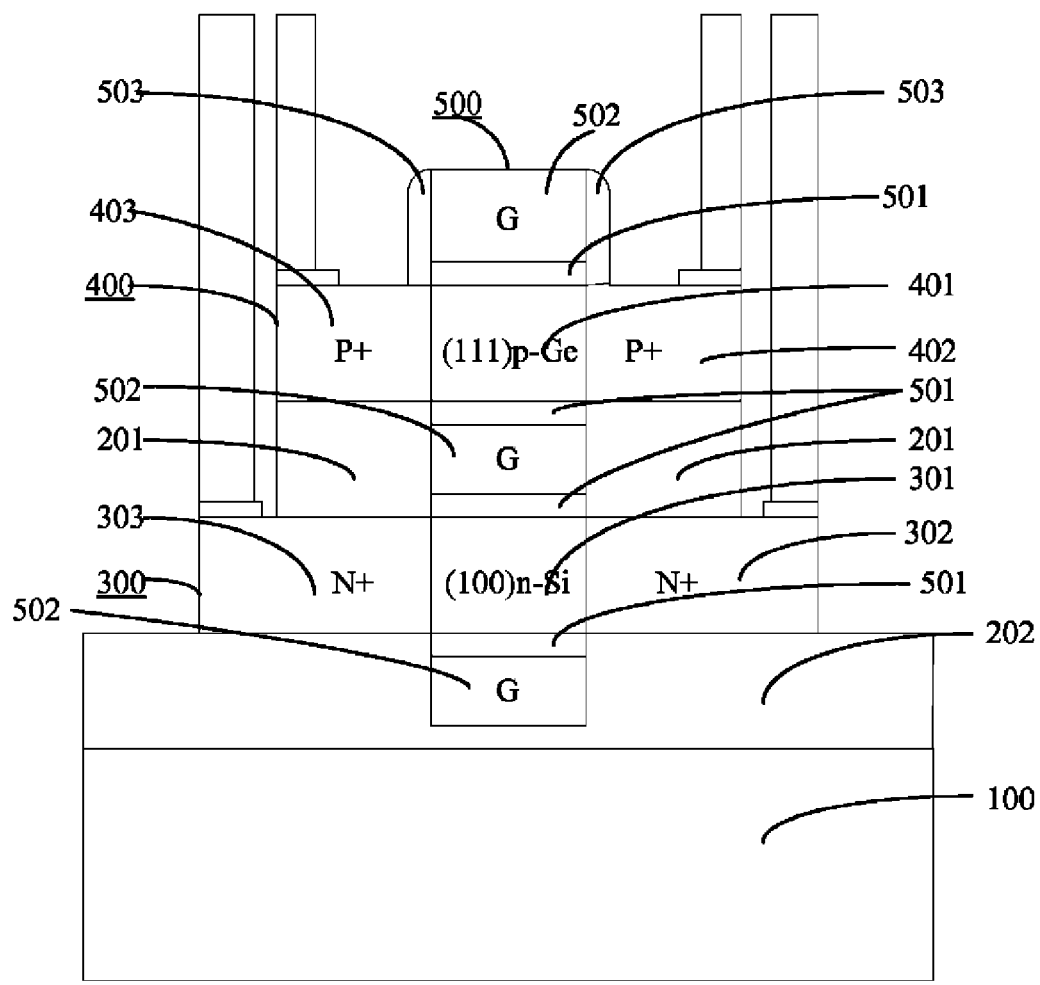

A FET transistor is fabricated based on the structure of FIG. 1b. FIG. 4a is a top view of the transistor and FIG. 4b is a cross-sectional view of the transistor. The fabrication processes include: forming a gate electrode on the gate electrode material layer 502, forming source electrodes in the source region 403 of the PMOS region and the source region 303 of the NMOS region, respectively, and forming drain electrodes in the drain region 402 of the PMOS region and the drain region 302 of the NMOS region, respectively. To optimize the device performance, dielectric spacers 503 are disposed at the two sides of the gate, and the spacers can be made of silicon dioxide or silicon nitride.

Second Embodiment

Figure 5A:
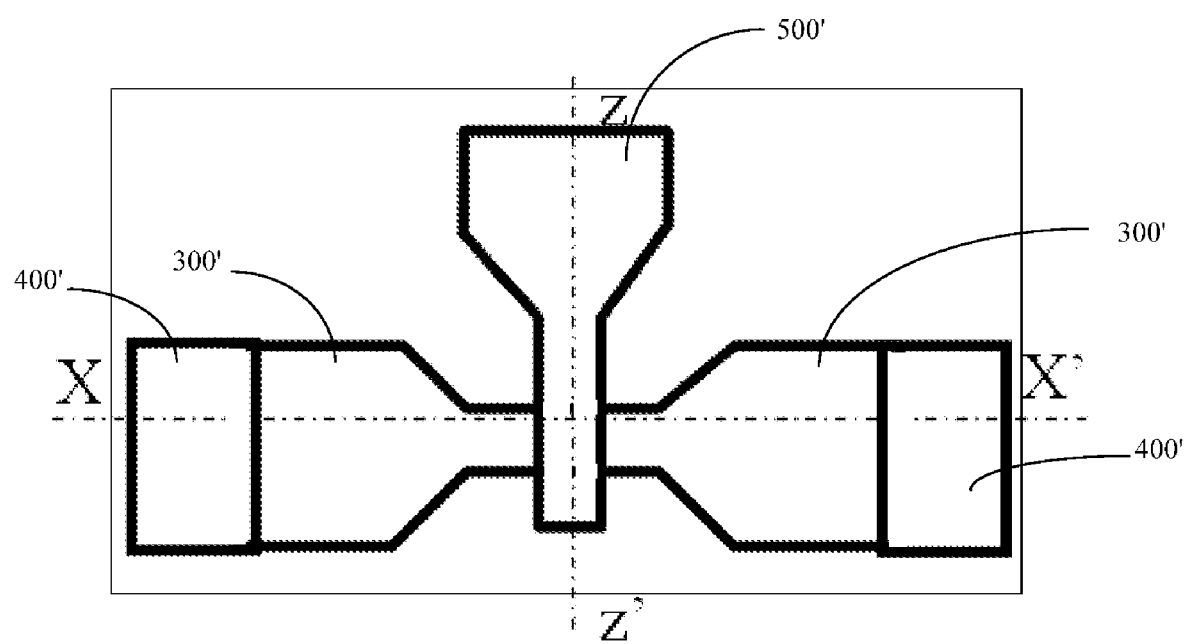
Figure 5B:
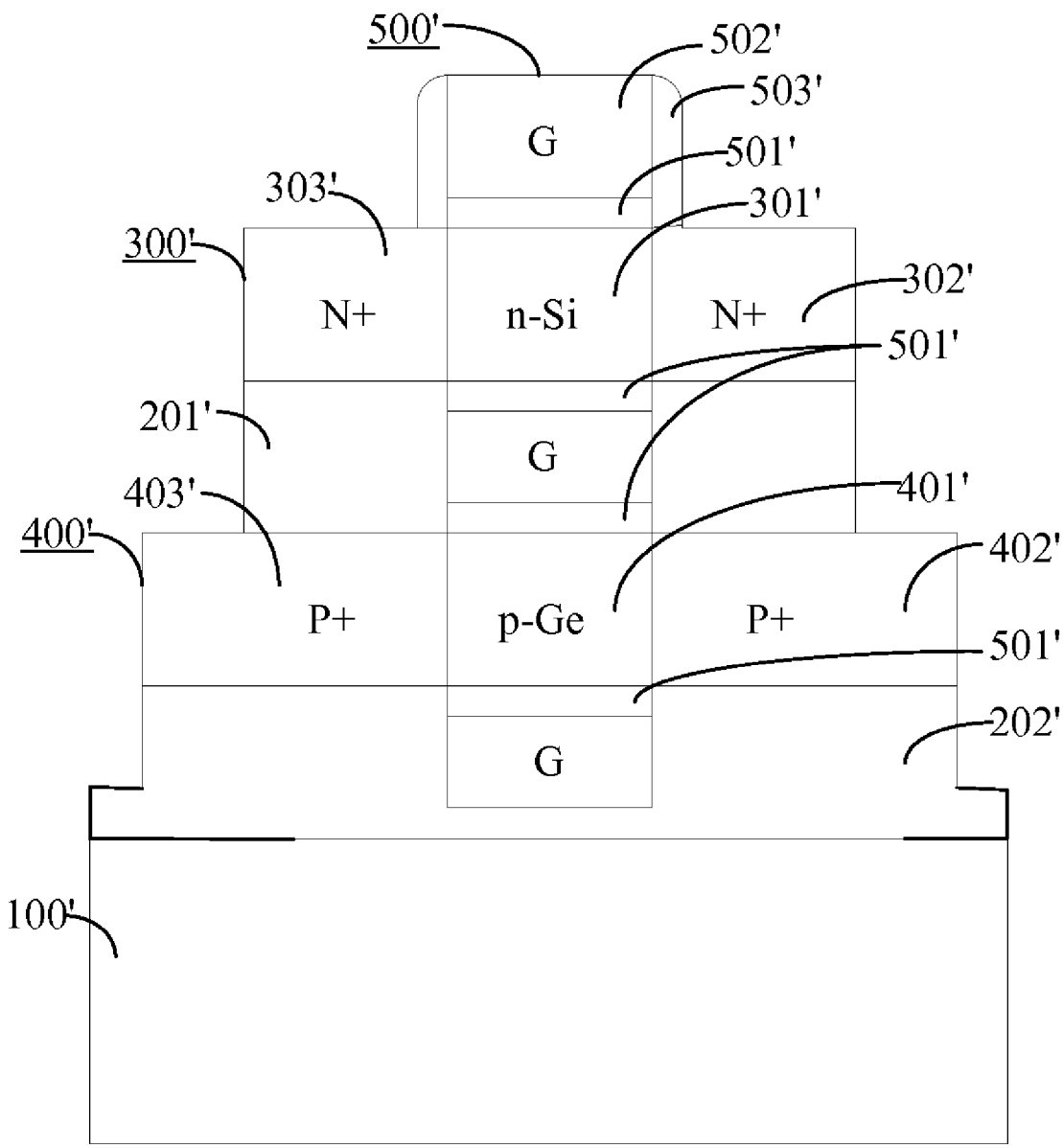
Figure 5C:
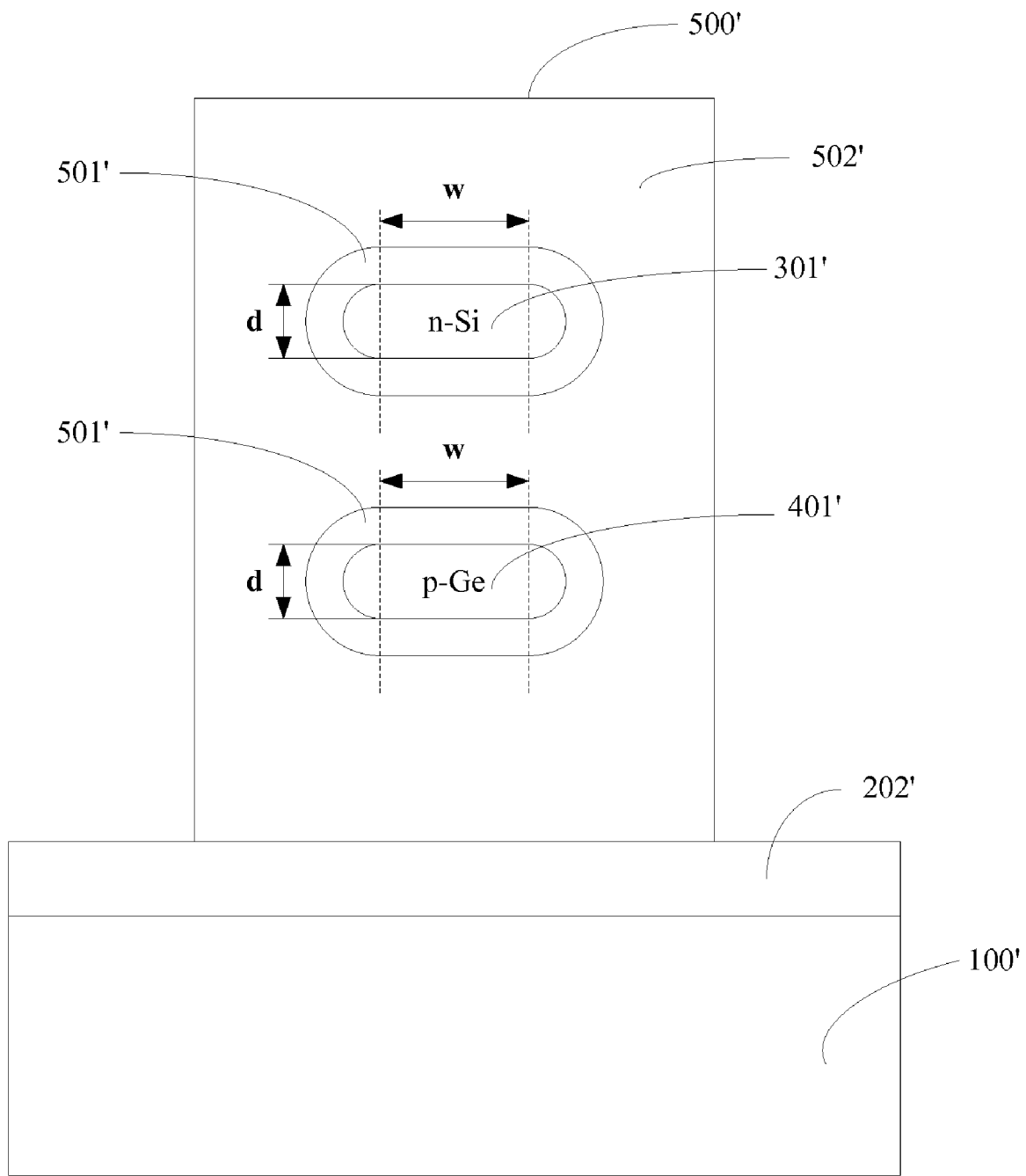
Figure 6A:
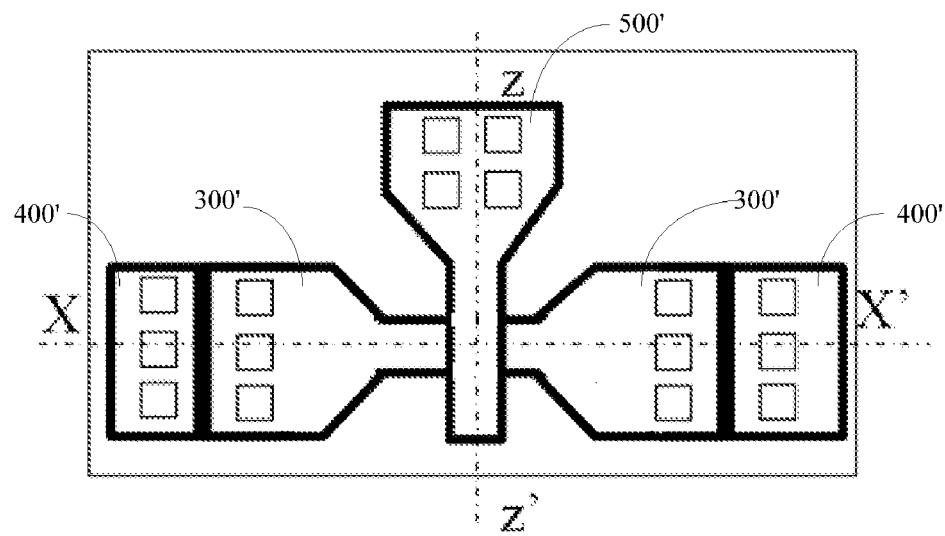
FIG. 6a is a top view of an accumulation mode FET according to the second embodiment of the present invention.
Figure 6B:
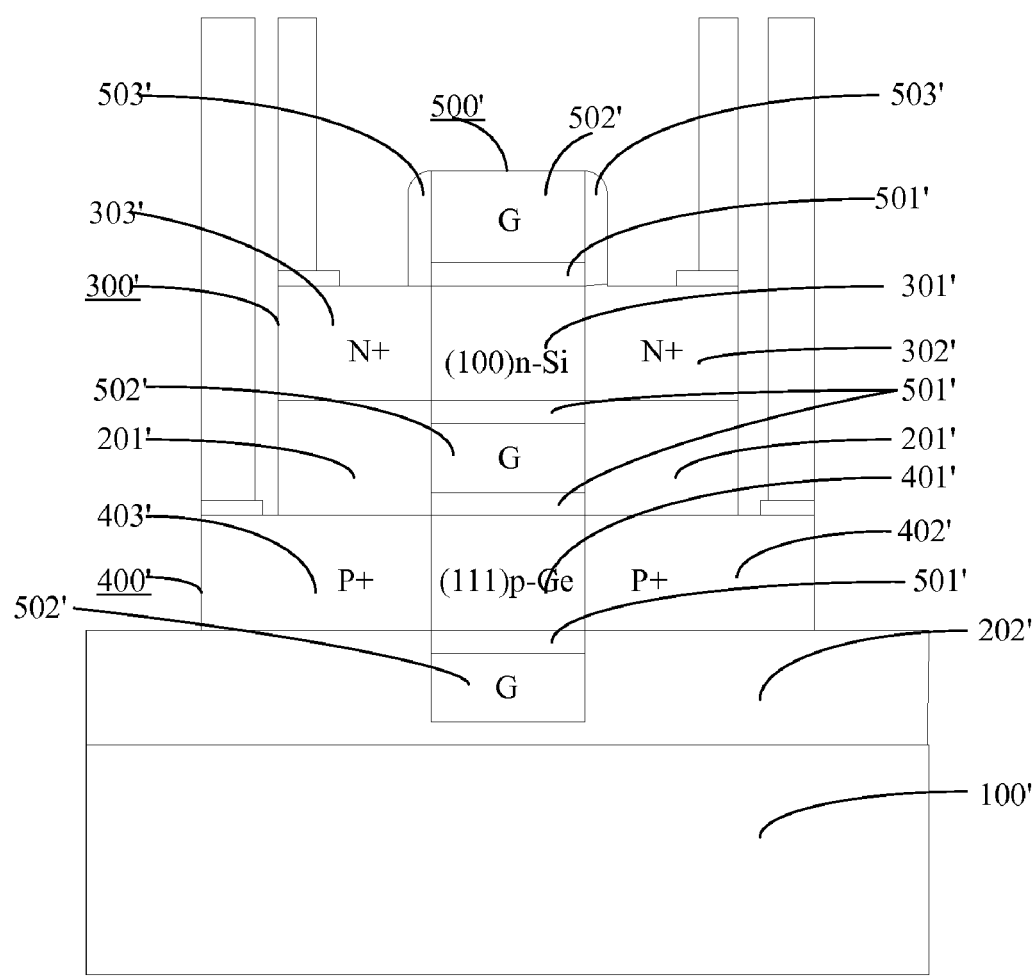

FIGS. 5a-5c shows another embodiment of the device. The hybrid material accumulation mode GAA CMOSFET includes: a semiconductor substrate 100', a PMOS region 400' having a channel 401', an NMOS region 300' having a channel 301', and a gate region 500'. The channel 401' and the channel 301' each has a racetrack-shaped cross section having a rectangular central portion and two semicircular end portions at the opposite ends of the rectangular central portion, and the channel 401' is made of a semiconductor material different from the channel 301'. In the present embodiment, the channel 401' is preferably formed of p-type Ge and the channel 301' is preferably formed of n-type Si. The gate region 500' surrounds the surfaces of the channels 401', 301'. A first buried oxide (BOX) layer 201' is disposed between the PMOS region 400' and the NMOS region 300', other than the gate region 500', to avoid inter-region interference. A second buried oxide (BOX) layer 202' is disposed between the PMOS region 400' and the underlying semiconductor substrate 100', other than the gate region 500', to isolate the PMOS region 400' from the substrate 100'. The PMOS region 400' comprises a source region 403' and a drain region 402' located at the opposite ends of the channel 401' respectively. The NMOS region 300' comprises a source region 303' and a drain region 302' located at the opposite ends of the channel 301' respectively. The gate region 500' includes: a gate dielectric layer 501' substantially surrounding the surfaces of the channels 401' and 301', and a gate electrode material layer 502' substantially surrounding the gate dielectric layer 501'.

Different from the first embodiment, the present embodiment has the NMOS region 300' on top and the PMOS region 400' close to the substrate 100'.

A transistor is fabricated based on the structure of FIG. 5c. FIG. 5a is a top view of the transistor, and FIG. 5b is a cross-sectional view of the transistor. The fabrication processes include: forming a gate electrode on the gate material layer 502', forming source electrodes in the source region 403' of the PMOS region and the source region 303' of the NMOS region, respectively, and forming drain electrodes in the drain region 402' of the PMOS region and the drain region 302' of the NMOS region, respectively. Further, spacers 503' are disposed at the two sides of the gate, the spacers can be made of silicon dioxide or silicon nitride.

The advantages of the present invention are explained as follows.

On one hand, the PMOS region and the NMOS region utilize different semiconductor materials (Ge and Si). Particularly, the first channel is formed of p-type Ge (111) and the second channel is formed of n-type Si (100). It has been shown through a variety of experiments that the hole mobility in Ge(111) is higher than that in Si(100). Therefore, by replacing Si(100) with Ge(111), the present invention improves the carrier (hole) mobility such that the device has better performance and better scaling down capability. On the other hand, the PMOS region and the NMOS region each have a buried oxide layer to be isolated from the substrate so as to effectively reduce the leakage current. Further, the GAA structure with the racetrack-shaped cross section is equivalent to a dual-gate channel structure and a GAAC (Gate-ALL-Around Cylindrical) structure, which are operated independently, which achieves the advantages of increasing the cross-sectional area of the channel (rectangular portion) and increasing the device drive current while maintaining the electrical integrity of the device (circular channel).

In order to further analyze the device performance of the first and second embodiments, a 3D simulation adopting a precise hydraulic model and a quantum mechanical density gradient model and applying a mobility degradation model related to doping and surface roughness is established. The simulation results show that the hybrid material accumulation mode GAA CMOSFET of the present invention has many advantages that the conventional fin-shaped FET devices (including rectangular or cylindrical GAA FETs) do not have.

Simulation result shows that, in an accumulation mode, current flows through the overall racetrack-shaped channel, so as to achieve high carrier mobility, reduce low-frequency noises, prevent polysilicon gate depletion and short channel effects, and increase the threshold voltage of the device. The on/off state current ratio of the device is more than doubled in the present invention compared with the case in non-hybrid material.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A hybrid material accumulation mode GAA (Gate-All-Around) CMOSFET (Complementary Metal Oxide Semiconductor Field Effect Transistor) comprising:
    a semiconductor substrate,
    an NMOS region stacked up above the semiconductor substrate, having a second channel, and including a source region and a drain region located at two opposite ends of the second channel respectively thereof,
    a PMOS region stacked up above the NMOS region, having a first channel, and including a source region and a drain region located at two opposite ends of the first channel respectively thereof,
    a gate region surrounding two surfaces of the first channel and the second channel substantially,
    a first buried oxide layer disposed between the PMOS region and the NMOS region other than the gate region, and
    a second buried oxide layer disposed between the NMOS region and the semiconductor substrate other than the gate region,
    wherein the first channel and the second channel each has a racetrack-shaped cross section having a rectangular central portion and two substantially semicircular end portions at the opposite ends of the rectangular central portion, the first channel is stacked up above the second channel and each of them is parallel to the semiconductor substrate, and the first channel is formed of p-type Ge and the second channel is formed of n-type Si.

2. The CMOSFET of claim 1, wherein the source region and the drain region of the PMOS region are formed of heavily doped p-type Ge, and the source region and the drain region of the NMOS region are formed of heavily doped n-type Si.

3. The CMOSFET of claim 2, wherein Ge in the PMOS region is Ge (111), and Si in the NMOS region is Si (100).

4. The CMOSFET of claim 1, wherein the gate region further comprises: a gate dielectric layer substantially surrounding the surfaces of the first channel and the second channel, and a gate electrode material layer substantially surrounding the gate dielectric layer.

5. The CMOSFET of claim 4, wherein the gate dielectric layer is selected from the group consisting of silicon dioxide, silicon oxynitride, silicon oxycarbide and a hafnium-based high-k material.

6. The CMOSFET of claim 4, wherein the gate electrode material layer is selected from the group consisting of titanium, nickel, tantalum, tungsten, tantalum nitride, tungsten nitride, titanium nitride, titanium silicide, tungsten silicide, nickel silicide, and a combination thereof.

7. The CMOSFET of claim 1, wherein the first buried oxide layer and the second buried oxide layer are formed of silicon dioxide.

8. The CMOSFET of claim 1, wherein a silicon passivation layer is further disposed between the surface of the first channel and the gate dielectric layer.

9. The CMOSFET of claim 8, wherein the silicon passivation layer has a thickness in the range of 0.5-1.5 nm.

10. A hybrid material accumulation mode GAA (Gate-All-Around) CMOSFET (Complementary Metal Oxide Semiconductor Field Effect Transistor) comprising:
a semiconductor substrate,
a PMOS region stacked up above the semiconductor substrate, having a first channel and including a source region and a drain region located at two opposite ends of the first channel respectively thereof,
an NMOS region stacked above the PMOS region, having a second channel and including a source region and a drain region located at two opposite ends of the second channel respectively thereof,
a gate region surrounding two surfaces of the first channel and the second channel substantially,
a first buried oxide layer disposed between the PMOS region and the NMOS region other than the gate region, and
a second buried oxide layer disposed between the PMOS region and the semiconductor substrate other than the gate region,
wherein the first channel and the second channel each has a racetrack-shaped cross section having a rectangular central portion and two substantially semicircular end portions at the opposite ends of the rectangular central portion, the first channel is stacked up above the second channel and each of them is parallel to the semiconductor substrate and the first channel is formed of p-type Ge and the second channel is formed of n-type Si.

11. The CMOSFET of claim 10, wherein the source region and the drain region of the PMOS region are formed of heavily doped p-type Ge, and the source region and the drain region of the NMOS region are formed of heavily doped n-type Si.

12. The CMOSFET of claim 11, wherein Ge in the PMOS region is Ge (111), and Si in the NMOS region is Si (100).

13. The CMOSFET of claim 10, wherein the gate region further comprises: a gate dielectric layer substantially surrounding the surfaces of the first channel and the second channel, and a gate electrode material layer substantially surrounding the gate dielectric layer.

14. The CMOSFET of claim 13, wherein the gate dielectric layer is selected from the group consisting of silicon dioxide, silicon oxynitride, silicon oxycarbide and a hafnium-based high-k material.

15. The CMOSFET of claim 13, wherein the gate electrode material layer is selected from the group consisting of titanium, nickel, tantalum, tungsten, tantalum nitride, tungsten nitride, titanium nitride, titanium silicide, tungsten silicide, nickel silicide, and a combination thereof.

16. The CMOSFET of claim 10, wherein the first buried oxide layer and the second buried oxide layer are formed of silicon dioxide.

17. The CMOSFET of claim 10, wherein a silicon passivation layer is further disposed between the surface of the first channel and the gate dielectric layer.

18. The CMOSFET of claim 17, wherein the silicon passivation layer has a thickness in the range of 0.5-1.5 nm.

* * * * *